United States Patent
Parthasarathy et al.

(10) Patent No.: US 9,438,033 B2
(45) Date of Patent: Sep. 6, 2016

(54) APPARATUS AND METHOD FOR PROTECTING RF AND MICROWAVE INTEGRATED CIRCUITS

(71) Applicant: ANALOG DEVICES, INC., Norwood, MA (US)

(72) Inventors: Srivatsan Parthasarathy, Acton, MA (US); Rodrigo Carrillo-Ramirez, Chelmsford, MA (US)

(73) Assignee: Analog Devices, Inc., Norwood, MA (US)

( * ) Notice: Subject to any disclaimer, the term of this patent is extended or adjusted under 35 U.S.C. 154(b) by 350 days.

(21) Appl. No.: 14/084,350

(22) Filed: Nov. 19, 2013

(65) Prior Publication Data

US 2015/0138678 A1 May 21, 2015

(51) Int. Cl.
H02H 9/00 (2006.01)
H02H 9/04 (2006.01)
H01L 27/02 (2006.01)

(52) U.S. Cl.
CPC .......... H02H 9/046 (2013.01); H01L 27/0255 (2013.01); H02H 9/005 (2013.01)

(58) Field of Classification Search
USPC ........................................................ 361/56
See application file for complete search history.

(56) References Cited

U.S. PATENT DOCUMENTS

| | | | |
|---|---|---|---|
| 5,449,958 A * | 9/1995 | MacLauchlan | G01N 29/22 307/17 |
| 6,768,616 B2 | 7/2004 | Mergens et al. | |
| 7,570,467 B2 | 8/2009 | Watanabe et al. | |
| 8,299,871 B2 | 10/2012 | Carrillo-Ramirez | |
| 8,320,091 B2 | 11/2012 | Salcedo et al. | |
| 8,368,116 B2 | 2/2013 | Salcedo et al. | |
| 8,422,187 B2 | 4/2013 | Parthasarathy et al. | |
| 8,441,104 B1 | 5/2013 | Hu et al. | |
| 8,502,567 B2 | 8/2013 | Lawas | |
| 8,525,299 B2 | 9/2013 | Hu et al. | |
| 8,582,261 B2 | 11/2013 | Salcedo et al. | |
| 2002/0163768 A1 | 11/2002 | Kwon et al. | |
| 2002/0187601 A1 | 12/2002 | Lee et al. | |
| 2004/0164354 A1 | 8/2004 | Mergens et al. | |
| 2004/0207021 A1 | 10/2004 | Russ et al. | |
| 2005/0082618 A1 | 4/2005 | Wu et al. | |
| 2006/0109595 A1 | 5/2006 | Watanabe et al. | |
| 2006/0186467 A1 | 8/2006 | Pendharkar et al. | |
| 2007/0127404 A1* | 6/2007 | Best | H04J 3/02 370/314 |

(Continued)

OTHER PUBLICATIONS

Ker, Ming-Dou, and Yuan-Wen Hsiao, *ESD protection design with low-capacitance consideration for high-speed/high-frequency I/O interfaces in integrated circuits*, Recent Patents on Engineering 1.2, (2007), pp. 131-145.

(Continued)

*Primary Examiner* — Ronald W Leja
(74) *Attorney, Agent, or Firm* — Knobbe, Martens, Olson & Bear, LLP

(57) ABSTRACT

Electrostatic discharge (ESD) protection devices can protect electronic circuits. In the context of radio frequency (RF) circuits and the like, the insertion loss of conventional ESD protection devices can be undesirable. The amounts of parasitic capacitances at nodes of devices of an ESD protection device are not necessarily symmetrical, with respect to the substrate. Disclosed are techniques which decrease the parasitic capacitances at signal nodes, which improve the insertion loss characteristics of ESD protection devices.

18 Claims, 11 Drawing Sheets

(56) References Cited

U.S. PATENT DOCUMENTS

| | | |
|---|---|---|
| 2009/0045457 A1 | 2/2009 | Bodbe |
| 2009/0072315 A1 | 3/2009 | Hodel et al. |
| 2012/0074496 A1* | 3/2012 | Jalilizeinali ......... H01L 27/0255 257/355 |
| 2015/0038678 A1* | 2/2015 | Eaton ............... A61K 47/48215 530/351 |
| 2015/0138678 A1* | 5/2015 | Parthasarathy ........ H02H 9/005 361/56 |

OTHER PUBLICATIONS

Extended European Search Report in Corresponding European Patent Application No. 14192350.8.

* cited by examiner

APPARATUS AND METHOD FOR PROTECTING RF AND MICROWAVE INTEGRATED CIRCUITS

BACKGROUND OF THE INVENTION

1. Field of the Invention

Embodiments of the invention relate to electronic systems, and more particularly, to transient electrical event protection circuits.

2. Description of the Related Technology

Certain electronic systems can be exposed to a transient electrical event, or an electrical signal of a relatively short duration having rapidly changing voltage and high power. Transient electrical events can include, for example, electrostatic discharge (ESD) events.

Transient electrical events can damage integrated circuits (ICs) of an electronic system due to overvoltage conditions and/or high levels of power dissipation over relatively small areas of the ICs. High power dissipation can increase IC temperature. ESD can lead to numerous problems, such as shallow junction damage, narrow metal damage, and surface charge accumulation.

SUMMARY OF THE INVENTION

One embodiment includes an apparatus including an integrated circuit, wherein the apparatus includes: a first node configured to carry a signal; a second node configured to carry a voltage reference be the ground reference for the signal of the 1st node; a first voltage clamp of the integrated circuit, the first voltage clamp having an anode and a cathode, wherein a first parasitic capacitance associated with the anode is less than a second parasitic capacitance associated with the cathode, wherein the anode is operatively coupled to the first node, and the cathode is operatively coupled to the second node, the first voltage clamp comprising at least a first rectifier; and a second voltage clamp of the integrated circuit, the second voltage clamp having an anode and a cathode, wherein a third parasitic capacitance associated with the cathode is less than a fourth parasitic capacitance associated with the anode, wherein the anode is operatively coupled to the second node, and the cathode is operatively coupled to the first node, the second voltage clamp comprising at least a second rectifier.

One embodiment includes a method of protecting a radio frequency (RF) circuit from electrostatic discharge (ESD), wherein the method includes carrying a signal with a first node; carrying a voltage reference with a second node; clamping a voltage of the first node with a first voltage clamp of the integrated circuit, the first voltage clamp having an anode and a cathode, wherein a first parasitic capacitance associated with the anode is less than a second parasitic capacitance associated with the cathode, wherein the anode is operatively coupled to the first node, and the cathode is operatively coupled to the second node, the first voltage clamp comprising at least a first rectifier; and clamping the voltage of the first node with a second voltage clamp of the integrated circuit, the second voltage clamp having an anode and a cathode, wherein a third parasitic capacitance associated with the cathode is less than a fourth parasitic capacitance associated with the anode, wherein the anode is operatively coupled to the second node, and the cathode is operatively coupled to the first node, the second voltage clamp comprising at least a second rectifier.

BRIEF DESCRIPTION OF THE DRAWINGS

These drawings and the associated description herein are provided to illustrate specific embodiments of the invention and are not intended to be limiting.

DETAILED DESCRIPTION OF THE PREFERRED EMBODIMENT

Figure 1:
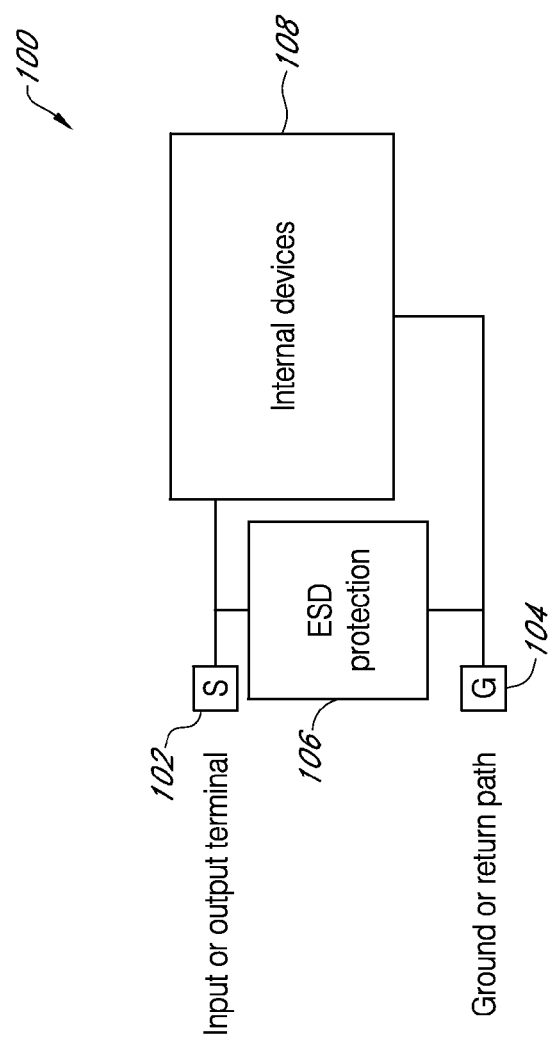
FIG. 1 is a schematic block diagram of an electrostatic discharge (ESD) protection device implemented in an integrated circuit.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Indeed, the higher dopant concentration regions of semiconductor devices are known as diffusion regions because the dopants tend to at least be partially defined by diffusion and thus by their very nature do not have sharp boundaries. Some boundaries as shown in the accompanying figures are of this type and are illustrated as abrupt structures merely for the assistance of the reader. In the embodiments described below, p-type regions can include a semiconductor material with a p-type dopant, such as boron. Further, n-type regions can include a semiconductor material with an n-type dopant, such as phosphorous. Further, gate dielectric can include insulators, such as high k-dielectric. Further, gates can include conductive regions with variable work functions, such as variable work-function metal or polysilicon. A skilled artisan will appreciate various concentrations of dopants, conductive materials and insulating material can be used in regions described below.

Electronic circuit reliability is enhanced by providing protection devices to the certain nodes of an IC, such as the IC's pins or pads. The protection devices can maintain the voltage level at the nodes within a predefined safe range by transitioning from a high-impedance state to a low-impedance state when the voltage of the transient signal reaches a trigger voltage. Thereafter, the protection device can shunt at least a portion of the current associated with the transient signal to prevent the voltage of the transient signal from reaching a positive or negative failure voltage that is one of the most common causes of IC damage.

FIG. 1 is a block diagram showing an ESD protection device 106 incorporated in an integrated circuit 100 to protect the internal devices 108 from sudden spikes in current or voltage due to an electrostatic discharge event occurring between a signal node 102 and a ground or return path node 104. Introduction of an ESD protection device is desirable, provided the ESD circuitry does not significantly distort the input signal. An ideal ESD protection device would be entirely invisible to the internal circuitry and the input; and as such would allow the entire range of input to pass through to the internal circuitry unaltered. However, in practice, ESD protection circuits contain parasitic elements that alter the input signals. Reducing these parasitic elements helps to avoid signal distortion.

An ESD protection device will introduce parasitic elements; most notably, junction and substrate capacitances. The junction capacitance is the result of a depletion region formed between oppositely doped implant regions and can be relatively small, such as on the order of 10 to 15 femtofarads (fF). A substrate capacitance is formed between some implanted regions and the substrate and can be many times larger than the junction capacitance. In certain embodiments, the ESD protection devices are arranged such that the signal encounters a junction capacitance first, and less of a substrate capacitance. This generates a total effective capacitance always smaller than the already small junction capacitance. This arrangement reduces signal loss to the substrate as compared to conventional approaches.

Figure 2:
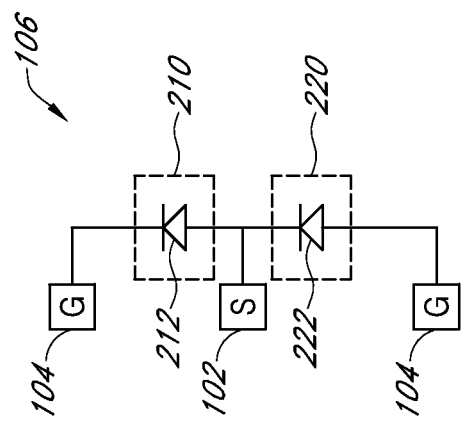
FIG. 2 is a schematic diagram of an embodiment of the ESD protection device.

FIG. 2 illustrates an embodiment of an ESD protection device that includes elements defined as voltage clamps which prevent the voltage level on a signal node from reaching undesirable values. These voltage clamps of the ESD protection device are arranged such that a signal applied to a signal node 102 encounters junction capacitances, and less of the substrate capacitances. The ESD protection device includes a signal node 102 configured to carry a signal and a ground or signal return path node 104 configured to carry a voltage reference, for example, ground. The ESD protection device further includes a first voltage clamp 210 and a second voltage clamp 220. The first voltage clamp 210 has an anode and a cathode, wherein the anode is operatively coupled to the signal node 102, and the cathode is operatively coupled to the ground or signal return path node 104. The voltage clamp 210 provides protection against positive voltage transients. The first voltage clamp 210 may include at least one rectifier, for example, a diode 212. The diode 212 has a junction capacitance and a substrate capacitance, and the diode 212 is arranged such that the anode end has the junction capacitance.

The ESD protection device further includes a second voltage clamp 220. The second voltage clamp 220 provides protection against negative voltage transients. The second voltage clamp 220 has an anode and a cathode, wherein the anode is operatively coupled to the ground or signal return path node 104, and the cathode is operatively coupled to the signal node 102. The second voltage clamp 220 may include at least one rectifier, for example, a diode 222. The diode 222 has a junction capacitance and a substrate capacitance and is arranged so that the cathode end has the junction capacitance. In alternative embodiments, the voltage clamps 210, 220 can include multiple diodes and/or thyristors, such as, but not limited to, 3 diodes and/or thyristors. Another name for a thyristor is a silicon-controlled rectifier (SCR). When multiple diodes and/or thyristors are used, the diodes and/or thyristors should be arranged such that the junction capacitances face towards the signal node 102 in the signal path and the substrate capacitances face away from the signal node 102 in the signal path.

Figure 3:
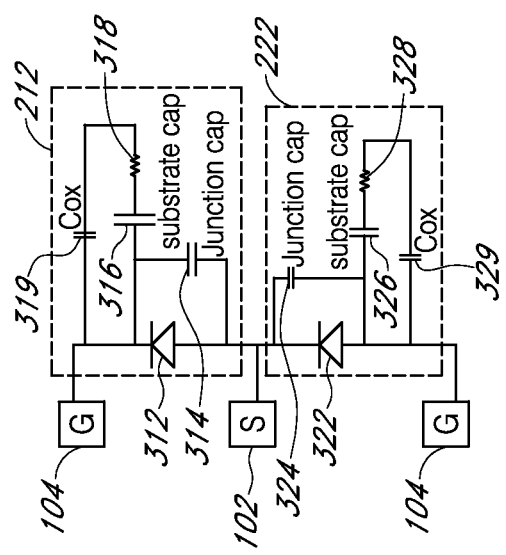
FIG. 3 is a schematic diagram of a model of an ESD protection device.

FIG. 3 is a schematic diagram of a model corresponding to the embodiment illustrated in FIG. 2 implemented with single diodes 212, 222 for the first and second voltage clamps 210, 220 Examples of parasitic capacitances are shown. Parasitic capacitances not shown can also be present. In particular, the diodes 212, 222 can have asymmetric parasitic capacitances due to the substrate. Thus, while the diodes 212, 222 are nominally 2-terminal devices, the amount of capacitance seen at the anode and at the cathode can vary due to parasitic capacitances to the substrate. The first diode 212 can be modeled as an ideal diode 312, a junction capacitance 314, substrate capacitance 316, a substrate resistance 318, and an oxide capacitance 319. The second diode 222 can be modeled as ideal diode 322, a junction capacitance 324, a substrate capacitance 326, a substrate resistance 328, and an oxide capacitance 329.

Figure 4:
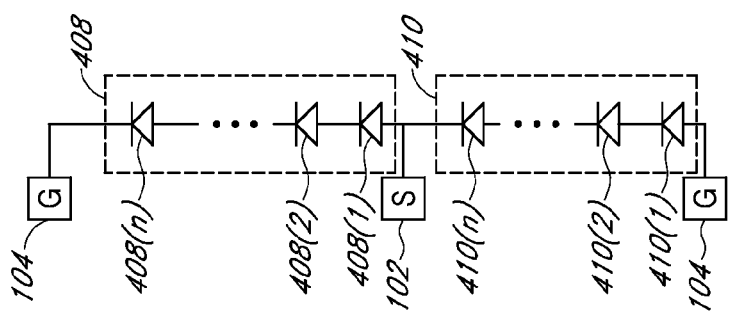
FIG. 4 illustrates an embodiment where the ESD protection device is implemented using several diodes in series.

FIG. 4 illustrates an embodiment of an ESD protection device intended for relatively large radio frequency (RF) signals. To provide ESD protection for relatively large RF signals, voltage clamps 408, 410 can include multiple diodes or thyristors 408(1)-408(n), 410(1)-410(n) arranged in series to increase the forward voltage drop and arranged such that a signal at the signal node 102 encounters junction capacitances and less of the substrate capacitances. Substrate capacitances are formed away from the signal, for example, closer to ground or signal return path node 104.

Figure 5:
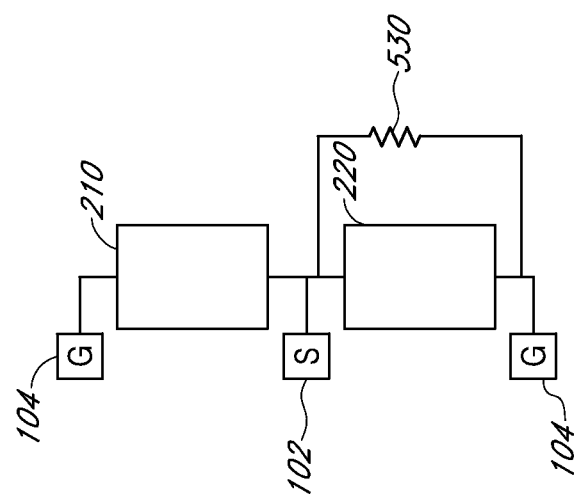
FIG. 5 illustrates an embodiment where the ESD protection device is in parallel with RF termination resistance.

FIG. 5 illustrates an embodiment where the ESD protection device includes a termination resistance 530 for the RF circuit for terminating a transmission line carrying the RF signal. Termination Resistance 530 may be implemented by two resistors in parallel (not shown), one from the signal 102 to ground 104 in high side protection circuitry 210 and one from signal 102 to ground 104 in low side protection circuitry 220. The value of the termination resistance can vary in a very broad range. A common value for the termination resistance 530 is about 50 ohms (Ω). Another common value is 75 ohms. Other values will be readily determined by one of ordinary skill in the art.

The impedance $Z_C$ due to the parasitic capacitance is given by equation 1.

$$Z_C = \frac{1}{j\omega C_{ESD}} \qquad \text{Eq. 1}$$

This impedance appears in parallel with the termination resistance 530. If parasitic capacitances are high, the impedance $Z_C$ will be a relatively low value, and the overall impedance seen by the RF signal input will be less than the termination resistance. If the impedance $Z_C$ is too low, the impedance matching of the termination resistance will be disturbed. Lower values of parasitic capacitances and higher values of $Z_C$ are desirable to help keep the overall impedance close to the value of termination resistance.

Figure 6:
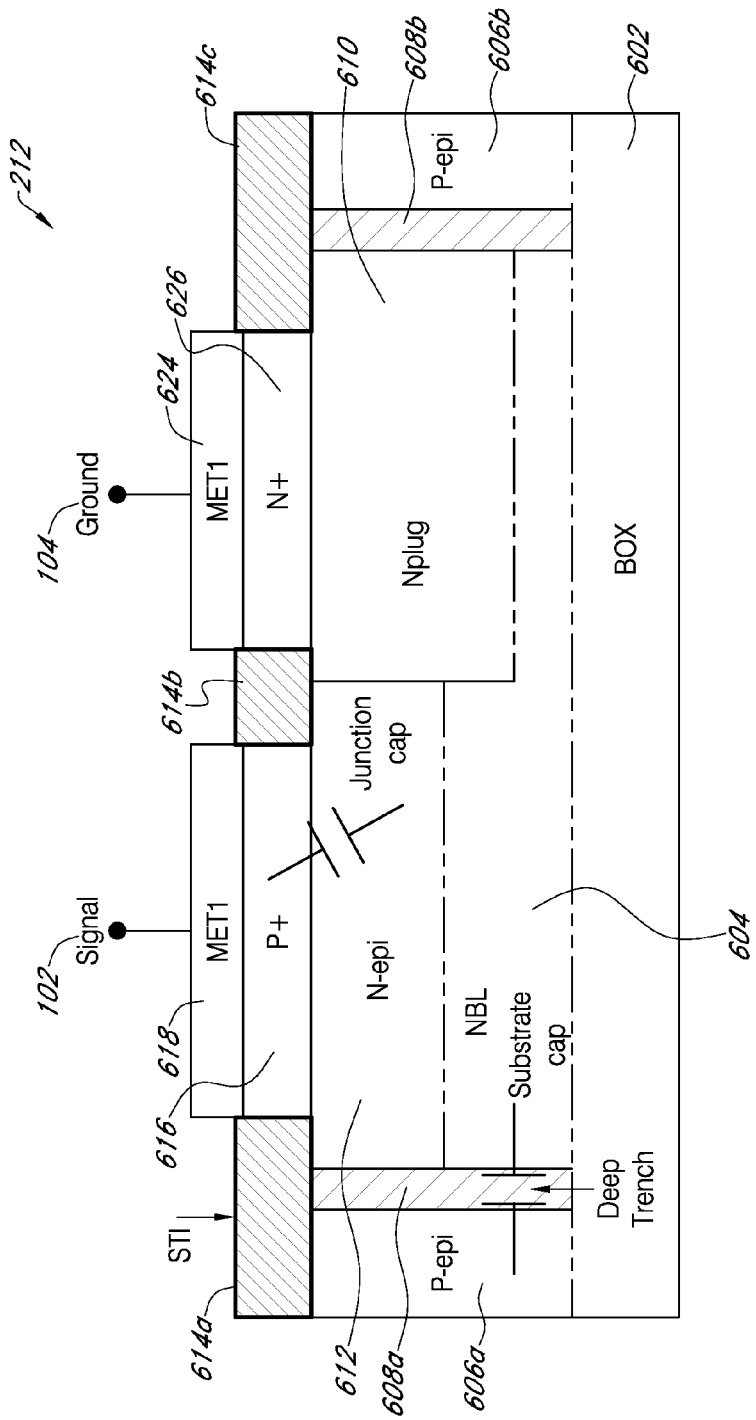
FIG. 6 is a cross-sectional view of an example of a physical layout for the high side protection circuitry of the ESD protection device of FIG. 2.

FIG. 6 is a cross-sectional view of an example of a layout for an embodiment of the diode 212 (FIG. 2) implemented in an integrated circuit with a p-type substrate, which can be a p-type epitaxial layer formed on a silicon substrate. An n-type substrate can alternatively be used (with the polarity of the diode, and all voltages and currents reversed). The diode 212 can be fabricated using a base-collector junction ordinarily used for a PNP transistor of the Integrated circuit fabrication process technology. A buried oxide layer (BOX layer) 602 can be used to provide isolation between different devices within the same region. Other methods of providing isolation might also be employed. The P-epi layer regions 606a, 606b correspond to the p-type substrate. An Nplug 610 connects an N buried layer (NBL) 604 to a contact 624, which is formed from metal layer 1 (MET1). The NBL 604 is a heavily doped region diffused relatively deeply into the substrate to help reduce the overall series resistance of the diode formed between a P+ region 616 and an N-epi layer region 612. Deep trench isolation regions 608a, 608b provide appropriate lateral isolation between the ESD protection device and surrounding regions. Deep trenches isolation can encircle the ESD protection device or devices. Other means of providing lateral isolation, not limited to deep trench regions, may also be used. The deep trench isolation regions 608a, 608b may be formed from silicon oxide ($SiO_2$) or any other customary type of isolation material, such as deep n-well, deep p-well, etc. The shallow trench isolation (STI) 614 regions provide isolation between different diffusion regions in integrated circuit fabrication process technology.

With respect to FIG. 6, the first and second P-epi layer regions 606a, 606b are disposed above a portion of the BOX layer 602 and adjacent to the deep trench isolation regions 608a, 608b. Deep trench isolation region 608a is above a portion of the BOX layer 602, to the right of the first P-epi layer region 606a, below a portion of the STI region 614a and to the left of a portion of the NBL 604 and the N-epi layer region 612. The NBL 604 is on top of a portion of the BOX layer 602, to the right of a portion of the deep trench isolation region 608a, below the N-epi layer region 612 and the N-plug 610, and to the left of a portion of the Nplug 610 and a portion of the deep trench isolation region 608b. The N-epi layer region 612 is on top of a portion of the NBL 604, to the right of a portion of the deep trench isolation region 608a, under a portion of the STI region 614a, under the P+ region 616, under a portion of the STI region 614b, and to the left of a portion of the Nplug 610.

The Nplug 610 is both above and to the right of a portion of the NBL 604, to the right of the N-epi layer region 612, and under a portion of the STI region 614b, under the N+ region 626, under a portion of the STI region 614c, and to the left of a portion of the deep trench isolation region 608b. The contact 618 for the anode is above the P+ region 616 and electrically connects the P+ region 616 to the signal node 102. The N+ region 626 is above the Nplug 610, flanked by the STI regions 614b, 614c to the left and right, and below the cathode contact 624. The cathode contact 624 is above N+ region 626 and electrically connects the N+ region 626 to ground or signal return path node 104.

The anode of the diode 212 is formed by the P+ region 616. The cathode of the diode 212 is formed by the arrangement of regions 612, 604, 610, 626. With the arrangement explained in FIG. 6, the signal node 102 is adjacent the junction capacitance formed between the P+ region 616 and the N-epi layer region 612. The substrate capacitance across the NBL layer 604, is formed away from the signal node 102.

The diode 212 is illustrated in the context of a p-type substrate 606. However, the teachings herein are applicable to other types of substrates. For example, the teachings herein are applicable to configurations using an n-type substrate in which the polarity of the illustrated active and well regions uses the opposite doping type.

Figure 7:
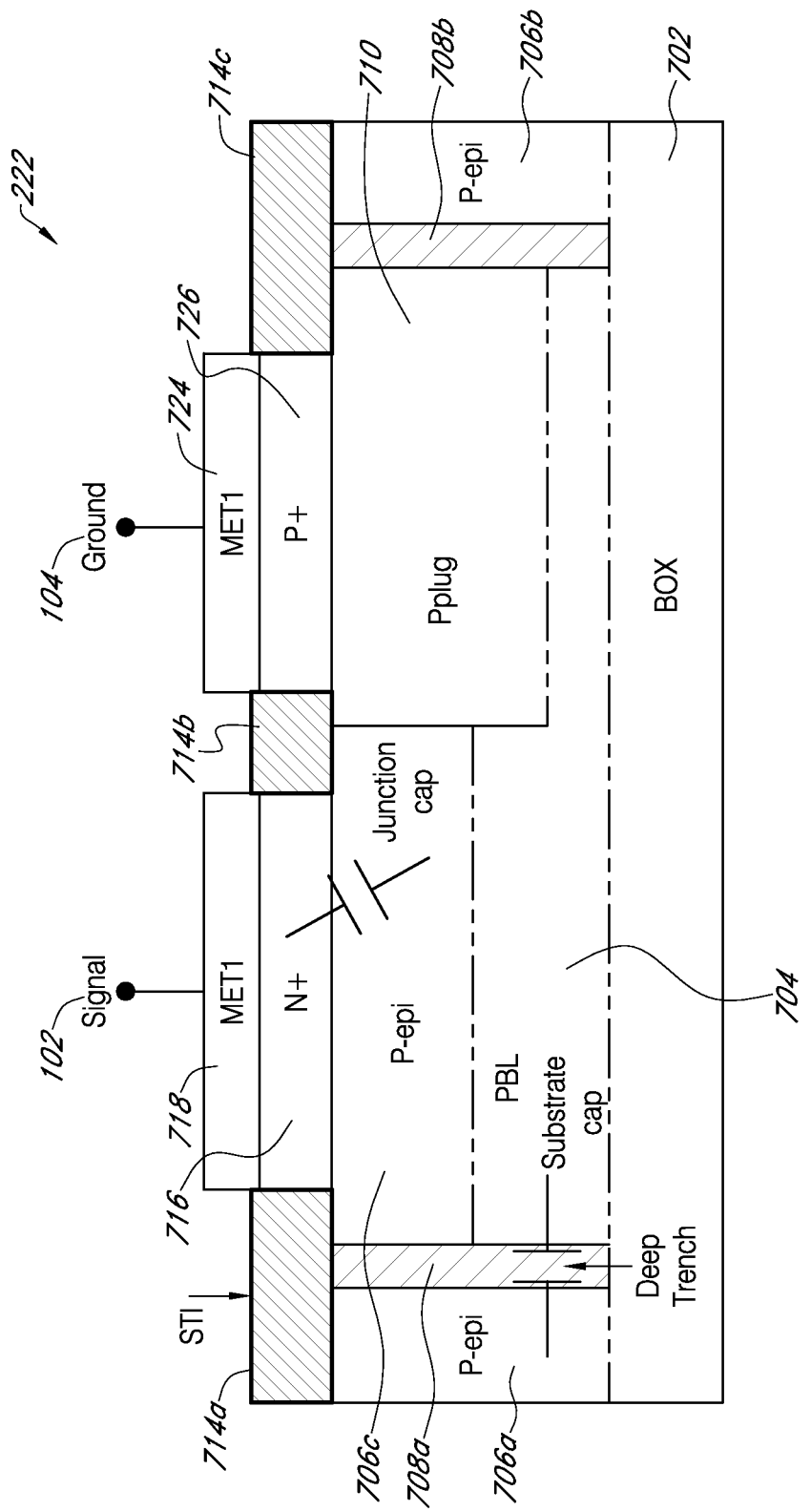
FIG. 7 is a cross-sectional view of an example of a physical layout for the low side protection circuitry of the ESD protection device of FIG. 2.

FIG. 7 is a cross-sectional view of an example of a layout for an embodiment of the diode 222 (FIG. 2) implemented with a p-type substrate. An n-type substrate can alternatively be used (with the polarity of the diode reversed). The diode 222 can be fabricated using a base-collector junction ordinarily used for an NPN transistor of the Integrated circuit fabrication process technology. A Pplug region 710 connects the P+ region 726 with the P buried layer (PBL) 704. The PBL 704 is a heavily doped region that is diffused relatively deeply into the substrate to help reduce the resistance of the diode 212 formed between the N+ region 716 and the P-epi layer region 706c. The P-epi layer regions 706a, 706b, 706c correspond to the p-type substrate.

With respect to FIG. 7, the first and second P-epi layer regions 706a, 706b are disposed above a portion of the BOX layer 702 and adjacent to deep trench isolation regions 708a, 708b. Deep trench isolation region 708a is above a portion of the BOX layer 702, to the right of the first P-epi layer region 706a, below a portion of the STI region 714a and to the left of a portion of the PBL 704 and the P-epi layer region 706c. The PBL 704 is on top of a portion of the BOX layer 702, to the right of a portion of the deep trench isolation region 708a, below the P-epi layer region 706c and the Pplug 710, and to the left of a portion of the Pplug 710 and a portion of the deep trench isolation region 708b. The P-epi layer region 706c is on top of a portion of the PBL 704, to the right of a portion of the deep trench isolation region 708a, under a portion of the STI region 714a, under the N+ region 716, under a portion of the STI region 714b, and to the left of a portion of the Pplug 710.

The Pplug 710 is both above and to the right of a portion of the PBL 704, to the right of the P-epi layer region 706c, under a portion of the STI region 714b, under the P+ region 726, under a portion of the STI region 714c, and to the left of a portion of the deep trench isolation region 708b. A contact 718 for the cathode is above the N+ region 716 and electrically couples the N+ region 716 to the signal node 102. The P+ region 726 is above the Pplug 710, flanked by the STI regions 714b, 714c to the left and right, and below an anode contact 724. The anode contact 724 is above the P+ region 726 and electrically connects the P+ region 726 to ground or signal return path node 104.

The anode of the diode 222 is formed by the arrangement of regions 726, 710, 704, 706c. The cathode of the diode 222 is formed by N+ region 716. With the arrangement explained in FIG. 7, the signal node 102 is adjacent the junction capacitance formed between the N+ region 716 and the P-epi layer region 706c. The substrate capacitance formed across the PBL 704 is formed away from the signal node 102.

Figure 8:
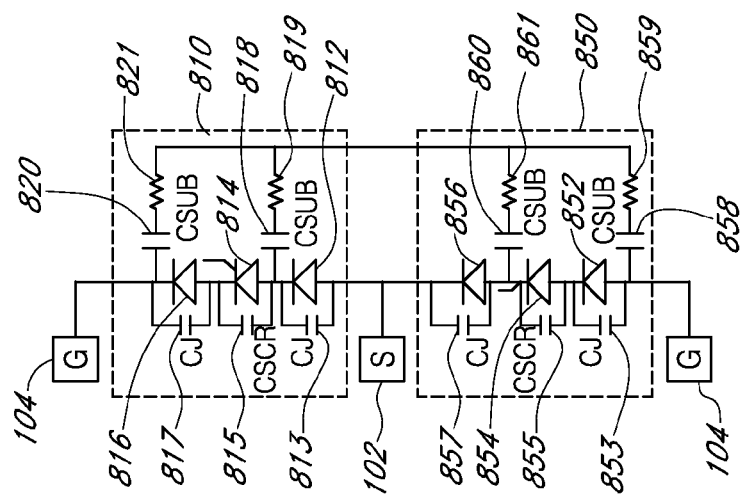
FIG. 8 illustrates a model of an embodiment where the ESD protection device is implemented using both diodes and thyristors

FIG. 8 illustrates a model of an embodiment for ESD protection in relatively large signal applications, such as from −3V to +3V. The model includes a first voltage clamp 810, a second voltage clamp 850, and parasitics. With relatively large signals, a relatively large number of diodes may be used to cover the voltage range. However, relatively large numbers of diodes can increase the size of the ESD protection device on an integrated circuit so that it can be advantageous to include thyristors.

A thyristor can provide a larger voltage drop given the same amount of chip area than a forward-biased diode. The first voltage clamp 810 comprises a first diode 812, a thyristor 814 and a second diode 816 arranged in series, and the second voltage clamp 850 comprises a first diode 852, a thyristor 854, and a second diode 856 arranged in series. The anode of the first voltage clamp 810, which is also the anode of the first diode 812, is coupled to the signal node 102, and the cathode of the first voltage clamp 810, which is also the cathode of the second diode 816, is coupled to the signal return path node 104. The anode of the second voltage clamp 850, which is also the anode of the first diode 852, is coupled to the signal return path node 104, and the cathode of the second voltage clamp 850, which is also the cathode of the second diode 856, is coupled to the signal node 102.

The first diode 812 introduces a junction capacitance 813 and substrate capacitance 818. A thyristor 814 introduces a junction capacitance 815. The second diode 816 introduces a junction capacitance 817 and a substrate capacitance 820. The first diode 852 introduces a junction capacitance 853 and a substrate capacitance 858. A thyristor 854 introduces a junction capacitance 855. The second diode 856 introduces a junction capacitance 857 and a substrate capacitance 860. As further discussed below, the diodes and thyristors of the first and second voltage clamps may be arranged for the signal node 102 to be adjacent the junction capacitances 813, 857. The substrate capacitances 818, 820, 860 and 858 may be positioned away from the signal node 102 to reduce signal loss.

Figure 9:
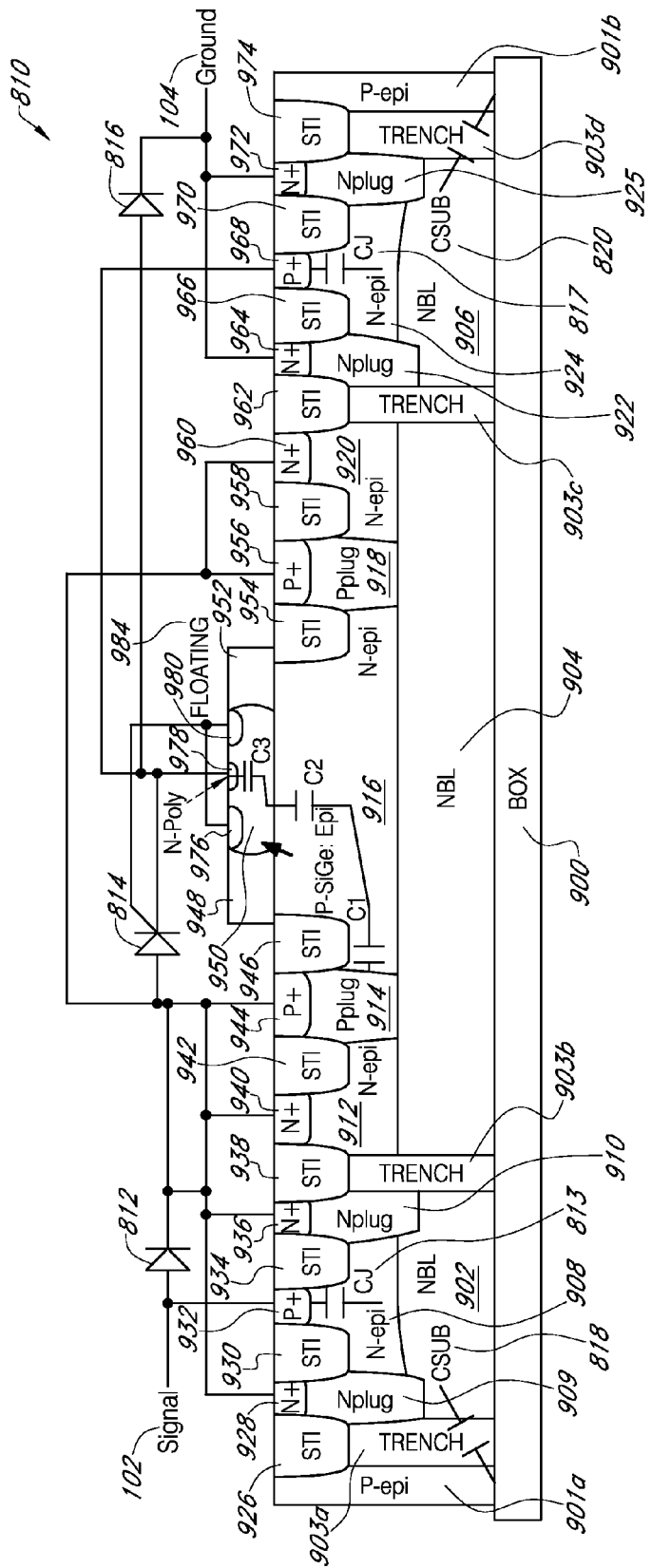
FIG. 9 is a cross-sectional view of the physical layout of the high side protection circuitry of the ESD protection device of FIG. 8.

FIG. 9 illustrates an example of a cross-sectional view for the first voltage clamp 810 implemented with a p-type substrate. FIG. 9 also illustrates symbols for the diodes 812, 816, and the thyristor 814 to illustrate the corresponding regions for the devices. In this view, the first voltage clamp 810 is above a BOX layer 900 and is flanked by P-epi layer regions 901a, 901b to the left and right. A NBL region 902 is formed above a portion of the BOX layer 900, to the right of a portion of a deep trench isolation region 903a, below an N-epi layer region 908, Nplug regions 909, 910, and to the left of a portion of a deep trench isolation region 903b. The NBL 904 is above a portion of the BOX layer 900, to the right of a portion of the deep trench isolation region 903b, below the N-epi layer region 912, the Pplug 914, the N-epi layer region 916, the Pplug 918, the N-epi layer region 920, and to the left of a portion of the deep trench isolation region 903c. The NBL 906 is above a portion of the BOX layer 900, to the right of a portion of the deep trench isolation region 903c, below the Nplug 922, the N-epi layer region 924, the Nplug 925 and to the left of a portion of the deep trench isolation region 903d.

In this view, the deep trench isolation region 903a is formed above the BOX layer 900, to the right of a portion of the P-epi layer region 901a, under the STI region 926, and to the left of a portion of the Nplug 909. The STI region 926 is formed above the deep trench isolation region 903a, to the right of the P-epi layer region 901a, and to the left of a portion of Nplug 909 and the N+ region 928. The N-epi layer region 908 is above a portion of the NBL 902, flanked by Nplug regions 909, 910, both under and to the right of the bottom and right lateral surfaces of the STI region 930, both under and to the left of the bottom and left lateral surfaces of the STI region 934, and below the P+ region 932.

The N+ region 928 is formed above the Nplug region 909 and is flanked by the STI regions 926, 930 to the left and right. The STI region 930 is both above and to the left of the N-epi layer region 908 on its bottom and right lateral surfaces, to the right of a portion of region Nplug 909, the N+ region 928 and to the left of the P+ region 932. The P+ region 932 is above the N-epi layer region 908 and is flanked by STI regions 930, 934 to the left and right. The STI region 934 is both above and to the right of the N-epi layer region 908 on its bottom and left lateral surfaces, to the right of the P+ region 932 and to the left of a portion of the Nplug 910 and the N+ region 936. The N+ region 936 is above Nplug 910, to the right of the STI region 934 and to the left of the STI region 938. The STI region 938 is above the deep trench isolation region 903b, to the right of a portion of the Nplug 910, N+ region 936 and to the left of N+ region 940. The deep trench isolation region 903b is above the BOX layer 900 to the right of the NBL 902, a portion of the Nplug 910, under the STI region 938, to the left of the NBL 904 and a portion of the N-epi layer region 912.

The Nplug 909 is above the NBL 902, to the right of a portion of the deep trench isolation region 903a and the STI region 926, under N+ region 928, to the left of a portion of the STI region 930 and the N-epi layer region 908. The Nplug 910 is above a portion of the NBL 902, to the right of the N-epi layer region 908, the STI region 934, under the N+ region 936, to the left of a portion of the deep trench isolation region 903b and the STI region 938. The N-epi layer region 912 is above a portion of the NBL 904, to the right of a portion of the deep trench isolation region 903b and the STI region 938, under the N+ region 940, both under and to the left of the STI region 942. The N+ region 940 is above the N-epi layer region 912 and is flanked by the STI regions 938, 942 to the left and right. The STI region 942 is both above and to the right of the N-epi layer region 912 on its bottom and left lateral surfaces, is flanked to the left and right by the N+ region 940 and the P+ region 944 and is to the left of the Pplug 914.

The Pplug 914 is above a portion of the NBL 904, to the right of the N-epi layer region 912 and the STI region 942, below the P+ region 944 and to the left of the STI region 946 and the N-epi layer region 916. The P+ region 944 is above the Pplug 914 and flanked by the STI regions 942, 946 to the left and right. The STI region 946 is both above and to the left of the N-epi layer region 916 on its bottom and right lateral surfaces, to the right of a portion of the Pplug 914, the P+ region 944 and below a portion of a silicon oxide region 948.

The N-epi layer region 916 is above a portion of the NBL 904, to the right of a portion of the Pplug 914, under and to the right of the right lateral surface of the STI region 946, below a portion of the silicon oxide regions 948, 952, below a P—SiGe: epi layer region 950, under and to the left of the left lateral surface of the STI region 954, and to the left of a portion of the Pplug 918. The STI region 954 is both above and to the right of the N-epi layer region 916 on its left lateral and bottom surfaces, to the left of the P+ region 956 and a portion of the Pplug 918.

The Pplug 918 is above a portion of the NBL 904, to the right of a portion of the N-epi layer region 916, the STI region 954, below the P+ region 956, to the left of a portion of the STI region 958 and the N-epi layer region 920. The P+ region 956 is above the Pplug 918, to the right of a portion of the STI region 954, and to the left of a portion of the STI region 958. The STI region 958 is both above and to the left of the N-epi layer region 920 on its bottom and right lateral surfaces, to the right of a portion of the Pplug 918, the P+ region 956, and to the left of the N+ region 960. The N+ region 960 is above the N-epi layer region 920, to the right of a portion of the STI region 958, and to the left of a portion of the STI region 962.

The N-epi layer region 920 is above a portion of the NBL 904, to the right of a portion of the Pplug 918, both under and to the right of bottom and right lateral surfaces of the STI region 958, below the N+ region 960, and to the left of a portion of the STI region 962 and the deep trench isolation region 903c. The deep trench isolation region 903c is above a portion of the BOX layer 900, to the right of the NBL 904, and a portion of N-epi 920, under the STI region 962, to the left of NBL 906 and a portion of Nplug 922. The STI region 962 is above the deep trench isolation region 903c and flanked by the N-epi layer region 920 and the N+ region 960 on the left and the Nplug 922 and the N+ region 964 on the right.

The N+ region 964 is above the Nplug 922, to the right of a portion of the STI region 962 and to the left of a portion of the STI region 966. The Nplug 922 is above the NBL region 906, to the right of a portion of the deep trench isolation region 903c, the STI region 962, below the N+ region 964 and to the left of a portion of the STI region 966. The N-epi layer region 924 is above a portion of the NBL 906, flanked by the Nplug regions 922, 925, both under and to the right of the bottom and right lateral surfaces of the STI region 966, both under and to the left of the bottom and left lateral surfaces of the STI region 970, and below the P+ region 968.

The STI region 966 is both above and to the left of the N-epi layer region 924 on its bottom and right lateral surfaces, to the right of a portion of the Nplug 922, the N+ region 964, and to the left of the P+ region 968. The P+ region 968 is above a portion of the N-epi layer region 924 and flanked by the STI region 966 and the STI region 970. The STI region 970 is both above and to the right of the N-epi layer region 924 on its bottom and left lateral surfaces, to the right of the P+ region 968, to the left of the N+ region 972 and a portion of the Nplug 925.

The N+ region 972 is above the Nplug 925 and is flanked by the STI region 970 and the STI region 974. The Nplug 925 is above a portion of the NBL 906, to the right of a portion of the N-epi layer region 924, the STI region 970, under the N+ region 972, to the left of a portion of the STI region 974 and the deep trench isolation region 903d. The STI region 974 is above the deep trench isolation region 903d, to the right of a portion of the Nplug 925, the N+ region 972, and to the left of the P-epi layer region 901b. The deep trench isolation region 903d is formed above a portion of the BOX layer 900, to the right of the NBL 906, the Nplug 925, under the STI region 974, and to the left of the P-epi layer region 901b.

In this view, the silicon oxide region 948 is above a portion of the STI region 946, a portion of the N-epi layer region 916, and to the left of the P—SiGe: epi layer region 950 and the P-poly region 976. The P-poly regions 976, 980 and N-Poly region 978 are surrounded by the P—SiGe: epi layer region 950 on their bottom and lateral surfaces. The P—SiGe: epi layer region 950 is above a portion of the N-epi layer region 916, flanked by the silicon oxide regions 948, 952, under and around left and right lateral surfaces of the P-poly regions 976, 980 and N-poly region 978. The silicon oxide region 952 is above a portion of the STI region 954, a portion of the N-epi layer region 916, and to the right of the P—SiGe: epi layer region 950 and the P-poly region 980.

The signal node 102 is electrically connected to the P+ region 932. The ground or signal return path node 104 is electrically connected to the N+ regions 964, 972. The N+ region 928, the N+ region 936, the N+ region 940, the P+ region 944, the P+ region 956 and the N+ region 960 are electrically connected. The P+ region 968 and the N-poly region 978 are also electrically connected. The P-poly regions 976 and 980 may be electrically connected and left floating 984. The anode of the first diode 812 is formed by the P+ region 932. The cathode of the first diode 812 is formed by the arrangement of regions 908, 910, 936. The anode of the thyristor 814 is formed by the regions 944, 914. The cathode of the thyristor 814 is formed by the region 978. The anode of the second diode 816 is formed by the P+ region 968 and its cathode is formed by the regions 964, 922, 924, 925 and 972.

With the arrangement explained in FIG. 9, the signal node 102 is adjacent the junction capacitance formed between the P+ region 932 and the N-epi layer region 908. The substrate capacitance 818 across the P-epi layer region 901a, the deep trench isolation region 903a, the NBL 902 and the Nplug 909 is formed away from the signal node 102. Likewise, the substrate capacitance 820 across the P-epi layer region 901b, the deep trench isolation region 903d, the NBL 906 and the Nplug 925 is formed away from the signal node 102.

Figure 10:
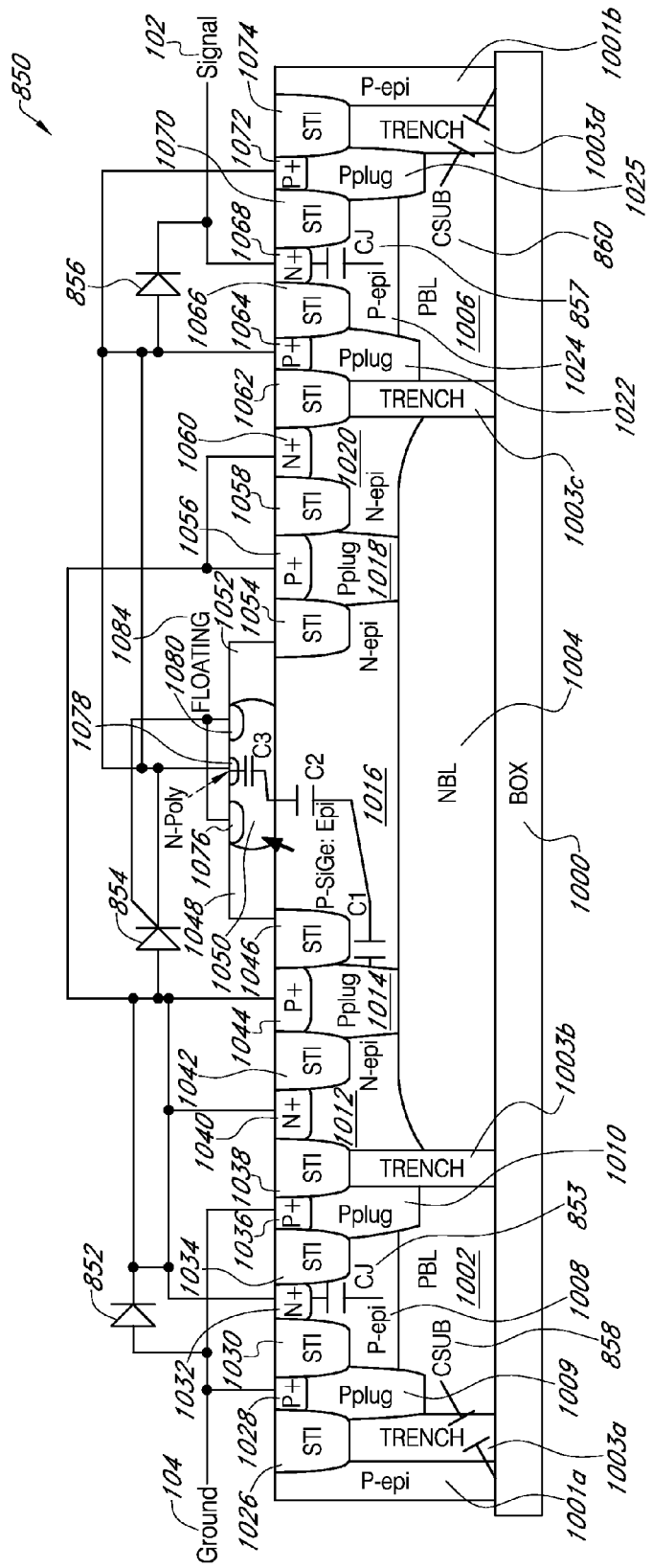
FIG. 10 is a cross-sectional view of the physical layout of the low side protection circuitry of the ESD protection device of FIG. 8.

FIG. 10 illustrates an example of a cross-sectional view for the second voltage clamp 850 implemented with a p-type substrate. FIG. 10 also illustrates symbols for the diodes 852, 856 and the thyristor 854 to illustrate the corresponding regions for the devices. In this view, the second voltage clamp 850 is formed above the BOX layer 1000, flanked by the P-epi layer regions 1001a and 1001b to the left and right. The PBL region 1002 is formed above a portion of the BOX layer 1000, to the right of a portion of the deep trench isolation region 1003a, below the P-epi layer region 1008, the Pplug regions 1009, 1010, and to the left of a portion of the deep trench isolation region 1003b. The NBL 1004 is above a portion of the BOX layer 1000, to the right of a portion of the deep trench isolation region 1003b, below the N-epi layer region 1012, the Pplug 1014, the N-epi layer region 1016, the Pplug 1018 and the N-epi layer region 1020, and to the left of a portion of the deep trench isolation region 1003c. The PBL 1006 is above a portion of the BOX layer 1000, to the right of a portion of the deep trench isolation region 1003c, below the Pplug 1022, the P-epi layer region 1024, and the Pplug 1025 and to the left of a portion of the deep trench isolation region 1003d.

In this view, the deep trench isolation region 1003a is formed above the BOX layer 1000, to the right of a portion of the P-epi layer region 1001a, under the STI region 1026, and to the left of a portion of the Pplug 1009. The STI region 1026 is formed above the deep trench isolation region 1003a, to the right of the P-epi layer region 1001a, and to the left of a portion of the Pplug 1009 and the P+ region 1028. The P-epi layer region 1008 is above a portion of the PBL 1002, flanked by the Pplug regions 1009, 1010, both under and to the right of the bottom and right lateral surfaces of the STI region 1030, both under and to the left of the bottom and left lateral surfaces of the STI region 1034, and below the N+ region 1032.

The P+ region 1028 is formed above the Pplug 1009 and is flanked by the STI regions 1026, 1030 to the left and right. The STI region 1030 is both above and to the left of the P-epi layer region 1008 on its bottom and right lateral surfaces, to the right of a portion of the Pplug 1009, the P+ region 1028 and to the left of the N+ region 1032. The N+ region 1032 is above the P-epi layer region 1008 and flanked by the STI regions 1030, 1034 to the left and right. The STI region 1034 is both above and to the right of the P-epi layer region 1008 on its bottom and left lateral surfaces, to the right of the N+ region 1032 and to the left of a portion of the Pplug 1010 and the P+ region 1036. The P+ region 1036 is above the Pplug 1010, to the right of the STI region 1034 and to the left of the STI region 1038. The STI region 1038 is above the deep trench isolation region 1003b, to the right of a portion of the Pplug 1010, the P+ region 1036 and to the left of the N+ region 1040. The deep trench isolation region 1003b is above the BOX layer 1000 to the right of the PBL 1002, a portion of the Pplug 1010, under the STI region 1038, to the left of the NBL 1004 and a portion of the N-epi layer region 1012.

The Pplug 1009 is above the PBL 1002, to the right of a portion of the deep trench isolation region 1003a and the STI region 1026, under the P+ region 1028, to the left of a portion of the STI region 1030 and the P-epi layer region 1008. The Pplug 1010 is above a portion of the PBL 1002, to the right of the P-epi layer region 1008, STI region 1034, under the P+ region 1036, to the left of a portion of the deep trench isolation region 1003b and the STI region 1038. The N-epi layer region 912 is above a portion of the NBL 1004, to the right of a portion of the deep trench isolation region 1003b and the STI region 1038, under the N+ region 1040, both under and to the left of the STI region 942. The N+ region 1040 is above the N-epi layer region 1012 and flanked by the STI regions 1038, 1042 to the left and right. The STI region 1042 is both above and to the right of the N-epi layer region 1012 on its bottom and left lateral surfaces, is flanked to the left and right by the N+ region 1040, and the P+ region 1044 and is to the left of the Pplug 1014.

The Pplug 1014 is above a portion of the NBL 1004, to the right of the N-epi layer region 1012 and the STI region 1042, below the P+ region 1044 and to the left of the STI region 1046 and the N-epi layer region 1016. The P+ region 1044 is above the Pplug 1014 and flanked by the STI regions 1042, 1046 to the left and right. The STI region 1046 is both above and to the left of the N-epi layer region 1016 on its bottom and right lateral surfaces, to the right of a portion of the Pplug 1014 and the P+ region 1044 and below a portion of the silicon oxide region 1048.

The N-epi layer region 1016 is above a portion of the NBL 1004, to the right of a portion of the Pplug 1014, under and to the right of the right lateral surface of the STI region 1046, below a portion of the silicon oxide regions 1048, 1052, below the P—SiGe: Epi layer region 1050, under and to the left of the left lateral surface of the STI region 1054, and to the left of a portion of the Pplug 1018. The STI region 1054 is both above and to the right of the N-epi layer region 1016 on its left lateral and bottom surfaces, to the left of the P+ region 1056 and a portion of the Pplug 1018.

The Pplug 1018 is above a portion of the NBL 1004, to the right of a portion of the N-epi layer region 1016, the STI region 1054, below the P+ region 1056, to the left of a portion of the STI region 1058 and the N-epi layer region 1020. The P+ region 1056 is above the Pplug 1018, to the right of a portion of the STI region 1054, and to the left of a portion of the STI region 1058. The STI region 1058 is both above and to the left of the N-epi layer region 1020 on its bottom and right lateral surfaces, to the right of a portion of the Pplug 1018, the P+ region 1056, and to the left of the N+ region 1060. The N+ region 1060 is above the N-epi layer region 1020, to the right of a portion of the STI region 1058, and to the left of a portion of the STI region 1062.

The N-epi layer region 1020 is above a portion of the NBL 1004, to the right of a portion of the Pplug 1018, both under and to the right of bottom and right lateral surfaces of the STI region 1058, below the N+ region 1060, and to the left of a portion of the STI region 1062 and the deep trench isolation region 1003c. The deep trench isolation region 1003c is above a portion of the BOX layer 1000, to the right of the NBL 1004, and a portion of the N-epi layer region 1020, under the STI region 1062, to the left of the PBL 1006 and a portion of the Pplug 1022. The STI region 1062 is above the deep trench isolation region 1003c and flanked by the N-epi layer region 1020 and the N+ region 1060 on the left and the Pplug 1022 and the P+ region 1064 on the right.

The P+ region 1064 is above the Pplug 1022, to the right of a portion of the STI region 1062 and to the left of a portion of the STI region 1066. The Pplug 1022 is above the PBL 1006, to the right of a portion of the deep trench isolation region 1003c, the STI region 1062, below the P+ region 1064 and to the left of a portion of the STI region 1066. The P-epi layer region 1024 is above a portion of the PBL 1006, flanked by the Pplug regions 1022, 1025, both under and to the right of the bottom and right lateral surfaces of the STI region 1066, both under and to the left of the bottom and left lateral surfaces of the STI region 1070, and below the N+ region 1068.

The STI region 1066 is both above and to the left of the P-epi layer region 1024 on its bottom and right lateral surfaces, to the right of a portion of the Pplug 1022, the P+ region 1064, and to the left of the N+ region 1068. The N+ region 1068 is above a portion of the P-epi layer region 1024 and flanked by the STI region 1066 and the STI region 1070. The STI region 1070 is both above and to the right of the P-epi layer region 1024 on its bottom and left lateral surfaces, to the right of the N+ region 1068, to the left of the P+ region 1072 and a portion of the Pplug 1025.

The P+ region 1072 is above the Pplug 1025 and is flanked by the STI region 1070 and the STI region 1074. The Pplug 1025 is above a portion of the PBL 1006, to the right of a portion of the P-epi layer region 1024, the STI region 1070, under the P+ region 1072, to the left of a portion of the STI region 1074 and the deep trench isolation region 1003d. The STI region 1074 is above the deep trench isolation region 1003d, to the right of a portion of the Pplug 1025, the P+ region 1072, and to the left of the P-epi layer region 1001b. The deep trench isolation region 1003d is formed above a portion of the BOX layer 1000, to the right of the PBL region 1006, the Pplug region 1025, under the STI region 1074, and to the left of the P-epi layer region 1001b. The BOX layer 1000 can be the same layer as the BOX layer 602 (FIG. 6), the BOX layer 702 (FIG. 7), and the BOX layer 900 (FIG. 9).

In this view, the silicon oxide region 1048 is above a portion of the STI region 1046, a portion of the N-epi layer region 1016, and to the left of the P—SiGe: epi layer region 1050 and the P-poly region 1076. The P-poly regions 1076, 1080 and N-poly region 1078 are surrounded by the P—SiGe: epi layer region 1050 on their bottom and lateral surfaces. The P—SiGe: epi layer region 1050 is above a portion of the N-epi layer region 1016, flanked by the silicon oxide regions 1048, 1052, under and around left and right lateral surfaces of the P-poly regions 1076 1080 and N-poly region 1078. The silicon oxide region 1052 is above a portion of the STI region 1054, a portion of the N-epi layer region 1016, and to the right of the P—SiGe: epi layer region 1050 and the P-poly region 1080.

The RF I/O or signal node 102 is electrically connected to the N+ region 1068. The ground or signal return path node 104 is electrically connected to the P+ regions 1028, 1036. The N+ region 1032, the N+ region 1040, the P+ region 1044, the P+ region 1056 and the N+ region 1060 are electrically connected. The P+ region 1064, the P+ region 1072, and the N-poly region 1078 are also electrically connected. The P-poly regions 1076 and 1080 may be electrically connected and left floating 1084. The anode of the diode 852 is formed by the arrangement of the regions 1028, 1009, 1008, 1010 and 1036. The cathode of the first diode 852 is formed by the N+ region 1032. The anode of the thyristor 854 is formed by the regions 1044, 1014. The cathode of the thyristor 854 is formed by the region 1078. The anode of the second diode 856 is formed by the regions 1064, 1022, 1024, 1025, 1072; its cathode is formed by the N+ region 1068.

With the arrangement explained in FIG. 10, the signal node 102 is adjacent the junction capacitance formed between the N+ region 1068 and the P-epi layer region 1024. The substrate capacitance 860 formed between the P-epi layer region 1001$b$, the deep trench isolation region 1003$d$, the PBL 1006 and the Pplug 1025 is away from the signal node 102. Likewise, the substrate capacitance 858 between the P-epi layer region 1001$a$, the deep trench isolation region 1003$a$, the PBL 1002 and the Pplug 1025 is formed away from the signal node 102.

The embodiments of the present invention are not limited to a particular process technology. Persons with ordinary skill in the art can envision embodiments of the present invention implemented using different process technologies. For example, proper substrate isolation may be achieved using a bulk bi-CMOS process or by a process offering deep N-well or P-well isolation.

Return Loss Ratio (RLR) is a metric used to describe the deleterious characteristics of an ESD protection device inserted into an RF circuit. RLR is the ratio of the amount of power passed through to the internal circuitry versus power reflected back to the signal input. RLR is generally expressed in decibels (dB). In the RF realm and several applications, an RLR of less than −10 dB is desirable.

Figure 11:
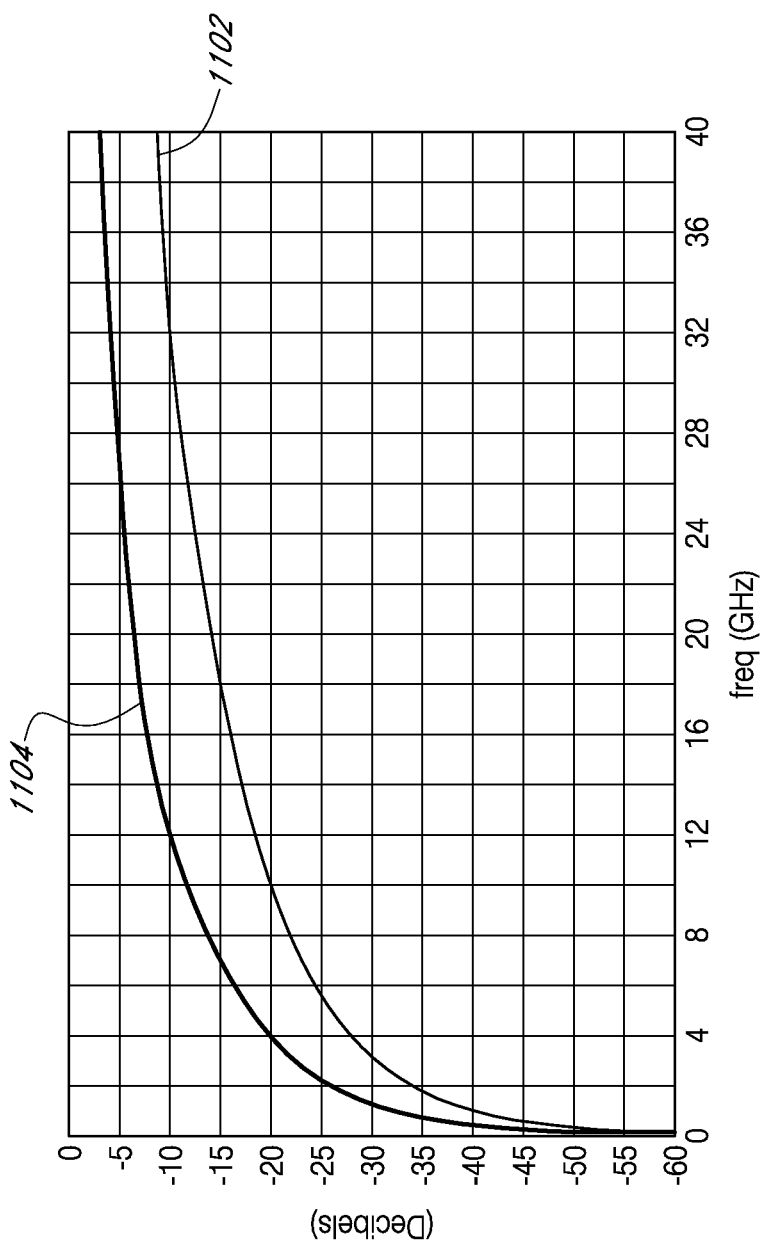
FIG. 11 is a plot of return loss ratio (RLR) versus frequency comparing a conventional device with an embodiment of the invention.

FIG. 11 is a graph of RLR versus frequency for two different ESD protection devices. A first curve 1102 represents the performance of an ESD protection device according to one embodiment of the invention. A second curve 1104 represents the performance of a conventional ESD protection device. As illustrated by the curves 1102, 1104, the ESD protection device according to an embodiment of the invention outperforms the conventional ESD protection device. In the illustrated example, the embodiment can achieve a RLR of less than −10 dB for frequencies up to about 34 gigahertz (GHz), which is a higher frequency range than the conventional ESD protection.

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks, including, for example base stations, serializer/deserializers, routers, modems, and the like. The consumer electronic products can include, but are not limited to, an automobile, a camcorder, a camera, a digital camera, a portable memory chip, desktop computers, workstations, servers, tablets, laptop computers, digital cameras, video cameras, digital media players, personal digital assistants, smart phones, mobile phones, navigation devices, non-volatile storage products, kiosks, modems, cable set-top boxes, satellite television boxes, gaming consoles, home entertainment systems, and the like. Further, the electronic device can include unfinished products, including those for industrial, medical and automotive applications.

The foregoing description and following claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

As used herein, a "node" refers to any internal or external reference point, connection point, junction, signal line, conductive element, or the like at which a given signal, logic level, voltage, data pattern, current, or quantity is present.

Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising an integrated circuit, the apparatus comprising:
    a first node configured to carry a signal;
    a second node configured to carry a voltage reference;
    a first voltage clamp of the integrated circuit, the first voltage clamp having an anode and a cathode, wherein a first parasitic capacitance associated with the anode and junction capacitance of the first voltage clamp is less than a second parasitic capacitance associated with the cathode and substrate capacitance of the first voltage clamp, wherein the anode is operatively coupled to the first node, and the cathode is operatively coupled to the second node, the first voltage clamp comprising at least a first rectifier; and
    a second voltage clamp of the integrated circuit, the second voltage clamp having an anode and a cathode, wherein a third parasitic capacitance associated with the cathode and junction capacitance of the second voltage clamp is less than a fourth parasitic capacitance associated with the anode and substrate capacitance of the second voltage clamp, wherein the anode is operatively coupled to the second node, and the cathode is operatively coupled to the first node, the second voltage clamp comprising at least a second rectifier.

2. The apparatus of claim 1, further comprising a termination resistance operatively coupled between the first node and the second node.

3. The apparatus of claim 1, wherein the first voltage clamp consists only of the first rectifier, wherein the second voltage clamp consists only of the second rectifier, and wherein the first rectifier and the second rectifier each consists of a diode.

4. The apparatus of claim 1, wherein the first voltage clamp consists only of the first rectifier, and wherein the first rectifier consists of a diode.

5. The apparatus of claim 1, wherein the second voltage clamp consists only of the second rectifier, and wherein the second rectifier consists of a diode.

6. The apparatus of claim 1, wherein the first voltage clamp comprises a first plurality of diodes arranged in series, wherein each diode of the first plurality has an anode and a cathode, wherein the anode of each diode of the first plurality has less parasitic capacitance than its cathode, wherein the second voltage clamp comprises a second plurality of diodes arranged in series, wherein each diode of the second plurality has an anode and a cathode, wherein the cathode of each diode of the second plurality has less parasitic capacitance than its anode.

7. The apparatus of claim 1, wherein the first voltage clamp comprises a first plurality of diodes arranged in series, wherein each diode of the first plurality has an anode and a cathode, wherein the anode of each diode of the first plurality has less parasitic capacitance than its cathode.

8. The apparatus of claim 1, wherein the second voltage clamp comprises a second plurality of diodes arranged in series, wherein each diode of the second plurality has an anode and a cathode, wherein the cathode of each diode of the second plurality has less parasitic capacitance than its anode.

9. The apparatus of claim 1, wherein the first and second voltage clamps each further comprises a thyristor.

10. The apparatus of claim 1, wherein the first voltage clamp further comprises a thyristor.

11. The apparatus of claim 1, wherein the second voltage clamp further comprises a thyristor.

12. A method of protecting a radio frequency (RF) circuit from electrostatic discharge (ESD), the method comprising:
   carrying a signal with a first node;
   carrying a voltage reference with a second node;
   clamping a voltage of the first node with a first voltage clamp of the integrated circuit, the first voltage clamp having an anode and a cathode, wherein a first parasitic capacitance associated with the anode and junction capacitance of the first voltage clamp is less than a second parasitic capacitance associated with the cathode and substrate capacitance of the first voltage clamp, wherein the anode is operatively coupled to the first node, and the cathode is operatively coupled to the second node, the first voltage clamp comprising at least a first rectifier; and
   clamping the voltage of the first node with a second voltage clamp of the integrated circuit, the second voltage clamp having an anode and a cathode, wherein a third parasitic capacitance associated with the cathode and junction capacitance of the second voltage clamp is less than a fourth parasitic capacitance associated with the anode and substrate capacitance of the second voltage clamp, wherein the anode is operatively coupled to the second node, and the cathode is operatively coupled to the first node, the second voltage clamp comprising at least a second rectifier.

13. The method of claim 12, further comprising terminating a transmission line operatively coupled to the first node and the second node with a termination resistance.

14. The method of claim 12, wherein the first voltage clamp consists only of the first rectifier, wherein the second voltage clamp consists only of the second rectifier, and wherein the first rectifier and the second rectifier each consists of a diode.

15. The method of claim 12, wherein the first voltage clamp comprises a first plurality of diodes arranged in series, wherein each diode of the first plurality has an anode and a cathode, wherein the anode of each diode of the first plurality has less parasitic capacitance than its cathode, wherein the second voltage clamp comprises a second plurality of diodes arranged in series, wherein each diode of the second plurality has an anode and a cathode, wherein the cathode of each diode of the second plurality has less parasitic capacitance than its anode.

16. The method of claim 12, wherein the first and second voltage clamps each further comprises a thyristor.

17. An apparatus comprising an integrated circuit, the apparatus comprising:
   a first node configured to carry a signal;
   a second node configured to carry a voltage reference;
   a means for clamping a voltage of the first node with a first voltage clamp of the integrated circuit, the first voltage clamp having an anode and a cathode, wherein a first parasitic capacitance associated with the anode and junction capacitance of the first voltage clamp is less than a second parasitic capacitance associated with the cathode and substrate capacitance of the first voltage clamp, wherein the anode is operatively coupled to the first node, and the cathode is operatively coupled to the second node; and
   a means for clamping the voltage of the first node with a second voltage clamp of the integrated circuit, the second voltage clamp having an anode and a cathode, wherein a third parasitic capacitance associated with the cathode and junction capacitance of the second voltage clamp is less than a fourth parasitic capacitance associated with the anode and substrate capacitance of the second voltage clamp, wherein the anode is operatively coupled to the second node, and the cathode is operatively coupled to the first node.

18. The apparatus of claim 17, further comprising a termination resistance operatively coupled between the first node and the second node.

* * * * *